United States Patent
Konishi et al.

[11] Patent Number: 6,012,858
[45] Date of Patent: Jan. 11, 2000

[54] APPARATUS AND METHOD FOR FORMING LIQUID FILM

[75] Inventors: Nobuo Konishi, Yamanashi-ken; Keizo Hirose, Kofu, both of Japan

[73] Assignee: Tokyo Electron Limited, Tokyo, Japan

[21] Appl. No.: 09/124,893

[22] Filed: Jul. 30, 1998

[30] Foreign Application Priority Data

Aug. 1, 1997 [JP] Japan .................................. 9-220922

[51] Int. Cl.$^7$ .................................................. G03D 5/00
[52] U.S. Cl. ........................................... 396/611; 118/52
[58] Field of Search .................................... 396/604, 611, 396/627; 118/52; 134/3, 902; 427/527, 532

[56] References Cited

U.S. PATENT DOCUMENTS

| | | | |
|---|---|---|---|
| 5,374,312 | 12/1994 | Hasebe et al. | 118/52 |
| 5,556,500 | 9/1996 | Hasegawa et al. | 156/345 |
| 5,625,433 | 4/1997 | Inada et al. | 396/604 |
| 5,748,434 | 5/1998 | Rossman et al. | 361/234 |
| 5,853,961 | 12/1998 | Sakai et al. | 396/611 |
| 5,857,127 | 1/1999 | Chu | 396/611 |

*Primary Examiner*—D. Rutledge
*Attorney, Agent, or Firm*—Oblon, Spivak, McClelland, Maier & Neustadt, P.C.

[57] ABSTRACT

A liquid film formation apparatus comprises a substrate holding portion for holding a substrate substantially horizontally so as to allow a pattern-to-be-formed surface to face upward, a liquid-receiving base surrounding the substrate held by the substrate holding portion and having a liquid-receiving face which is placed at substantially the same level as that of an upper surface of the substrate, a supply nozzle having a process-liquid spray section whose length is equal to or longer than the width of an effective region of the substrate, and a moving mechanism for moving the supply nozzle in the direction perpendicular to the longitudinal direction of the supply nozzle, in which the substrate holding portion seals a slit formed between the liquid-receiving base and the outer peripheral portion of the substrate so as not to leak out the process solution from the slit, and the process solution is supplied from the supply nozzle to the liquid-receiving base to mount the process solution on the liquid-receiving base, and the process solution is subsequently mounted over an entire surface of the substrate by spraying the process solution from the supply nozzle while moving the supply nozzle.

9 Claims, 11 Drawing Sheets

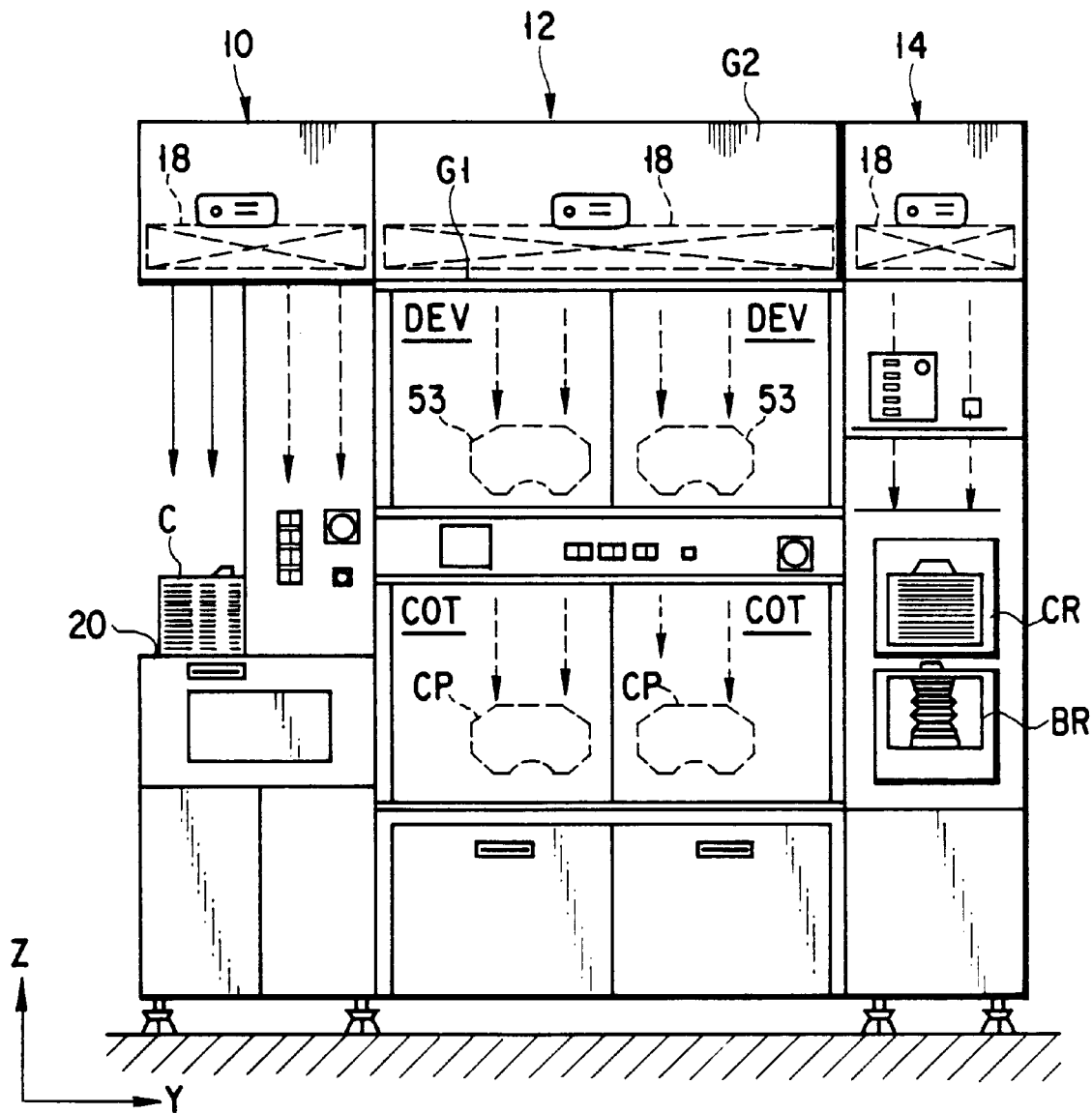
F I G. 5

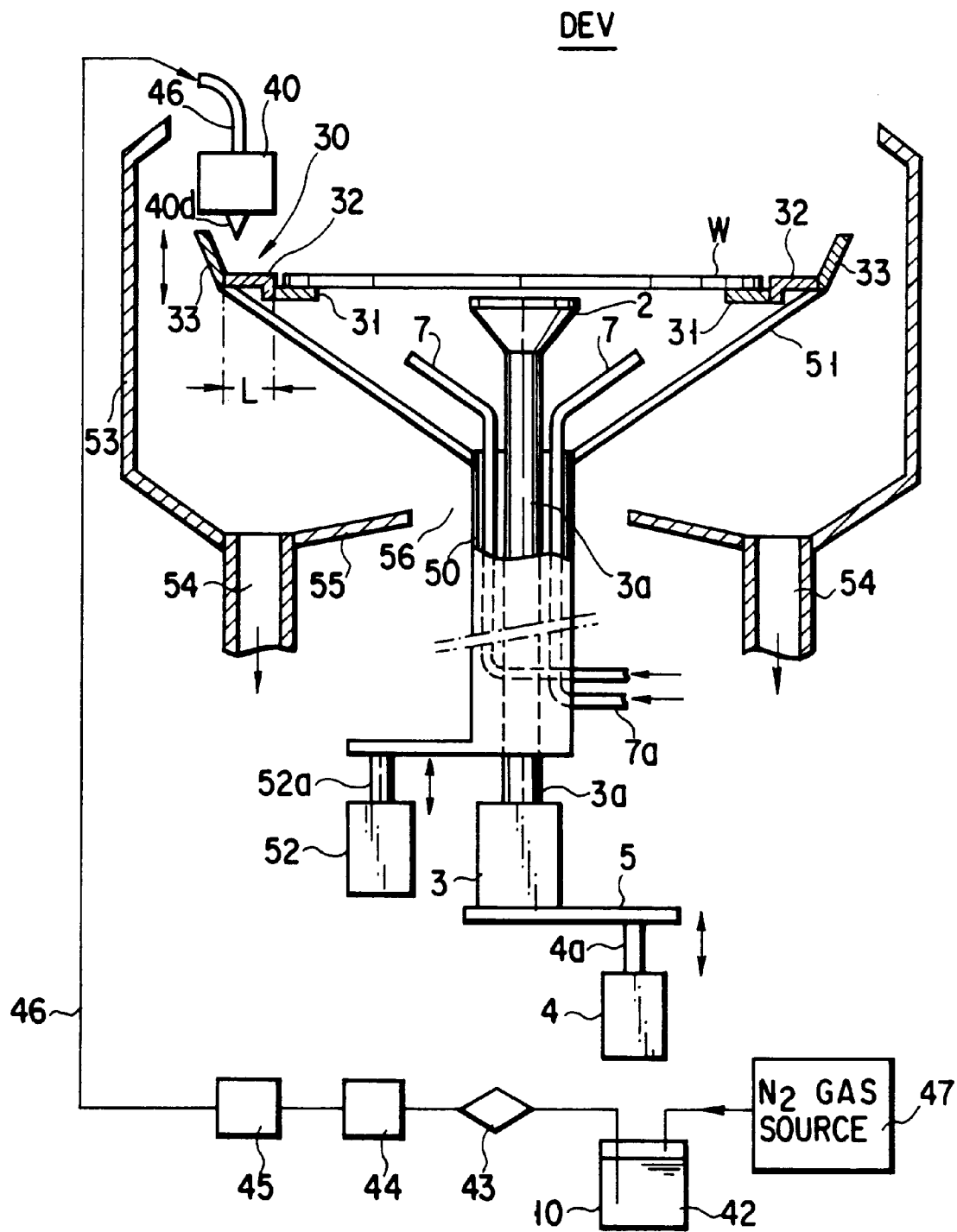
F I G. 6

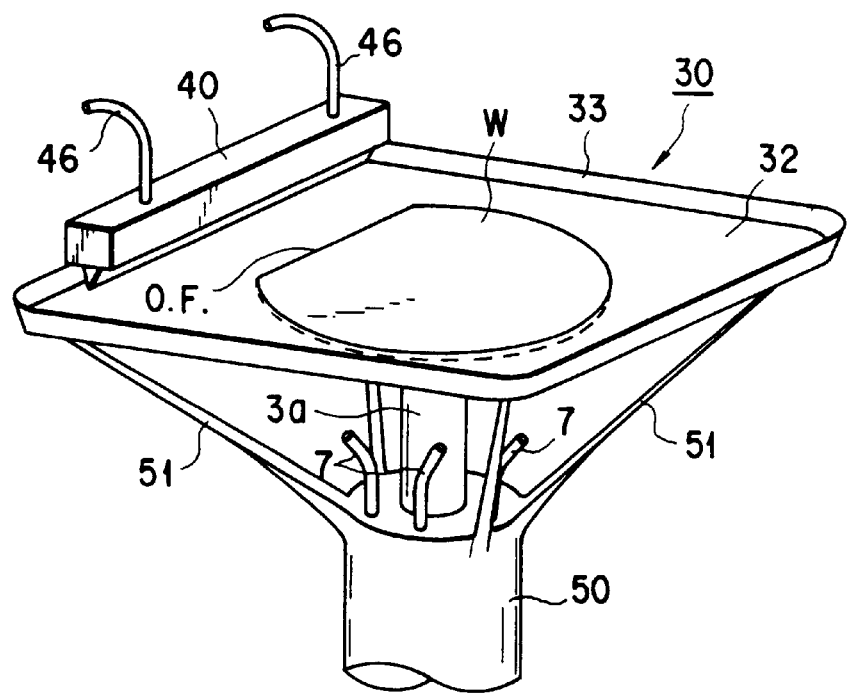
F I G. 7
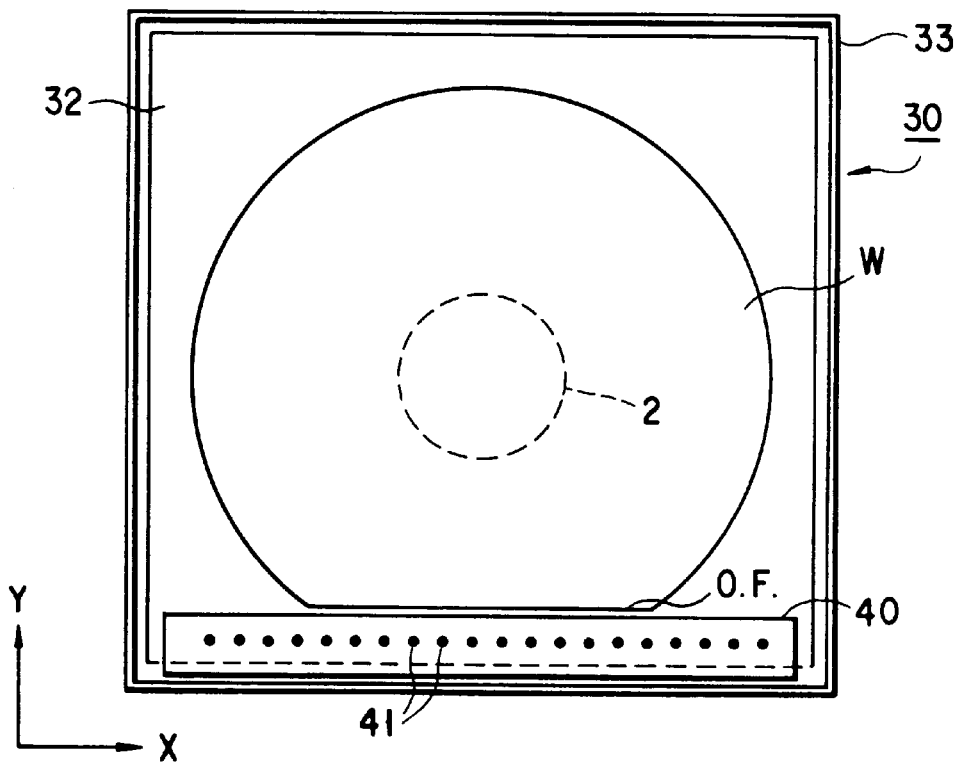
F I G. 8

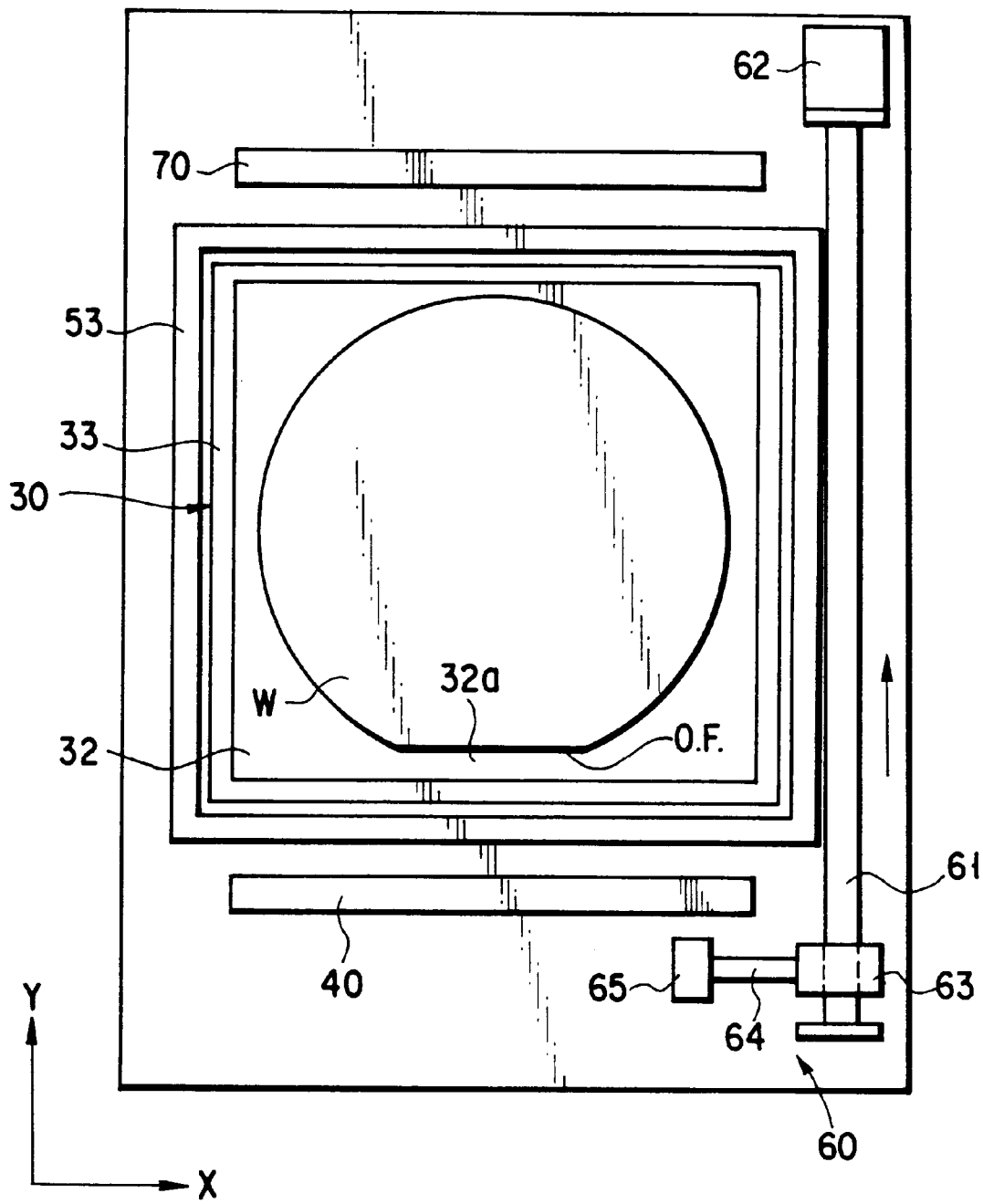
F I G. 9

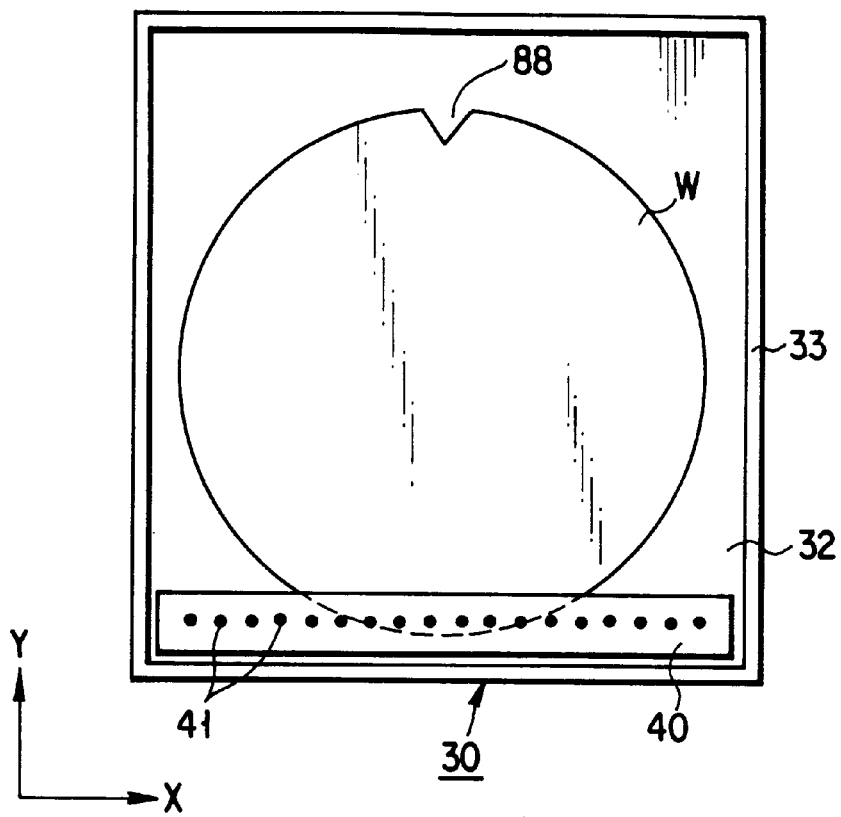
F I G. 16
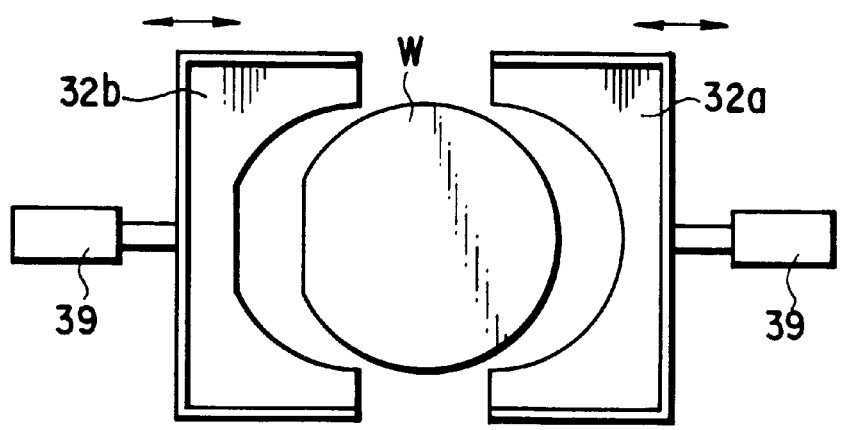
F I G. 17

APPARATUS AND METHOD FOR FORMING LIQUID FILM

BACKGROUND OF THE INVENTION

The present invention relates to an apparatus and method of forming a liquid film of a development solution for processing a thin film coated on a substrate.

In a photolithographic process for manufacturing a semiconductor device, a photoresist is coated on a wafer surface, and the resultant photoresist coating film is pattern-exposed and then developed by being exposed to a developing solution. In a conventionally-employed developing method (shown in FIGS. 1 and 2), a wafer W is vacuum-adsorbed by a spin chuck 111 and a supply nozzle 113 is positioned in such a way that spray holes 112 are placed in the proximity of an upper central portion of the wafer W. The supply nozzle 113, which has a length substantially equal to a diameter of wafer W, has numerous spray holes 112 arranged linearly along the longitudinal direction of the supply nozzle 113. A developing solution 10 is simultaneously sprayed from the numerous spray holes 112 to the wafer W, thereby mounting the developing solution 10 on the wafer W, as shown in FIG. 1. Thereafter, the wafer W is rotated by an angle of 180° while continuously supplying the developing solution 10 from the supply holes 112. In this way, a film of the developing solution 10 is formed over an entire surface of the wafer W. Note that the wafer must not be rotated in excess of 180° in order to prevent an initially supplied developing solution (proceeding developing solution) from being contaminated with a newly supplied developing solution (following developing solution). If the proceeding developing solution is contaminated with the following developing solution, a contaminated portion differs in resolution from a non-contaminated portion. As a result, the film is not developed uniformly.

However, the conventionally-employed method has the following problems. Before the developing solution is sprayed from the supply nozzle 113 to the wafer W, a predetermined amount of the developing solution is sprayed and discarded into the drain cup. This is called "dummy dispense". However, when the "dummy dispense" is carried out, liquid drops are attached to a tip portion of the supply nozzle 113 (i.e., around the spray holes 112), and the particles floating in the air are sometimes attached to the liquid drops. When the liquid drops are dried, the particles may drop on the wafer W, contaminating the wafer W.

The developing solution 10 is supplied by blowing a pressurized gas into a developing solution tank. The pressurized gas pushes out the developing solution 10 from the developing solution tank toward the supply nozzle 113. Therefore, gaseous ingredients of the pressurized gas are dissolved in the developing solution 10. The dissolved gaseous ingredients appear as micro bubbles on the wafer surface after the developing solution is sprayed. Due to the presence of micro bubbles, some regions of the film are not developed well (due to resolution impossible) or developed insufficiently (due to insufficient resolution), leading to developing defects. Since the wiring width of the circuit pattern has been reduced more and more in the recent days, the developing defect, even it is small, results in a fetal damage.

Another method is proposed as shown in FIG. 3. In the method, the supply nozzle 113 is placed along an orientation flat (O. F.) of the wafer W. The developing solution 10 is allowed to spray toward a non-pattern formation region outside the pattern formation region. Subsequently, the supply nozzle 113 is scan-moved along the surface of the wafer W in a Y-axis direction while spraying the developing solution. However, the length of the orientation flat (O. F.) is shorter than the diameter of the wafer W, the initially mounted developing solution 10 is spread sideward. Consequently, no developing solution 10 is applied in some regions and the developing solution 10 is applied but insufficient in other regions. In this case, even if the developing solution 10 is supplied from the nozzle 113 in a larger amount, the same phenomena are resulted. As a result, the film is not developed uniformly. Furthermore, in the case where a large-size (e.g., 12 inches) wafer W is used, a V notch 88 (shown in FIG. 16) is employed as crystal-orientation identification means in place of the orientation flat (O. F.). Therefore, the developing solution is initially mounted on an inevitably narrower space, resulting in non-uniform development.

BRIEF SUMMARY OF THE INVENTION

An object of the present invention is to provide an apparatus and method for forming a liquid film capable of forming a liquid film uniformly on a surface of a substrate and preventing contamination of the substrate with particles.

A liquid film formation apparatus according to the present invention comprises:

a substrate holding portion for holding a substrate substantially horizontally so as to allow a pattern-to-be-formed surface to face upward;

a liquid-receiving base surrounding the substrate held by the substrate holding portion and having a liquid-receiving face which is placed at substantially the same level as that of an upper surface of the substrate;

a supply nozzle having a process-liquid spray section whose length is equal to or longer than the width of an effective region of the substrate; and a moving mechanism for moving the supply nozzle in the direction perpendicular to the longitudinal direction of the supply nozzle;

in which the substrate holding portion seals a slit formed between the liquid-receiving base and the outer peripheral portion of the substrate so as not to leak out the process solution from the slit, and the process solution is supplied from the supply nozzle to the liquid-receiving base to mount the process solution on the liquid-receiving base, and the process solution is subsequently mounted over an entire surface of the substrate by spraying the process solution from the supply nozzle while moving the supply nozzle.

A method of forming a liquid film according to the present invention comprises the steps of:

(a) bringing a liquid-receiving base in contact with a periphery or in vicinity of a substrate held horizontally, the liquid-receiving base having a liquid-receiving face which is placed at substantially the same level of that of an upper surface of the substrate;

(b) mounting a process solution on the liquid-receiving base by supplying the process solution from a supply nozzle having a spray portion whose length is equal to or longer than a width of an effective region of the substrate; and (c) supplying the process solution from the supply nozzle while moving the supply nozzle in a direction perpendicular to the longitudinal direction of the supply nozzle, thereby mounting the process solution over an entire upper surface of the substrate.

According to the present invention, the process solution is initially mounted so as to cover the width of the effective region of the substrate (e.g. in a length equal to the diameter of the substrate). The mount of the process solution is extended along the integrated flat surface consisting of the wafer W and the liquid-receiving base therearound, at the same time, the process solution is supplied from the supply nozzle to form a liquid film of the process solution on the upper surface of the substrate. Hence, the process solution is mounted in an effective area of the substrate in the direction along which the process solution is mounted by being supplied from the supply nozzle, thereby suppressing the outward-spread of the process solution. As a result, the liquid film can be formed uniformly in thickness over the entire surface of the substrate. Then, even if the supply nozzle increases in moving speed, developing can be effected reliably in a high throughput.

Furthermore, even if particles are attached to the supply nozzle, it is possible to prevent the particles from being transferred from the nozzle to the substrate (wafer) and attached on the substrate. To describe more specifically, when the particles are attached to a tip portion of the supply nozzle, there is a high possibility that the particles contaminate the process solution when the process solution (developing solution) is supplied from the supply nozzle and initially mounted on the substrate. Whereas, in the present invention, the process solution is initially mounted on the liquid-receiving base positioned outside the substrate. Therefore, the process solution is not virtually spread toward the substrate. Even if the process solution is spread, the amount of the spread process solution is negligibly small. Hence, it is possible to prevent the contamination of the substrate with particles.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIG. 5 is a front view of showing the substrate process system;

FIG. 6 is a cross sectional view of an apparatus for forming a liquid film according to an embodiment of the present invention, accompanied with a block diagram of peripheral elements;

FIG. 7 is a perspective view of a gist portion of the apparatus according to the embodiment of the present invention;

FIG. 8 is a plan view of a gist portion of the apparatus according to the embodiment of the present invention;

FIG. 9 is a schematic plan view of the apparatus according to the embodiment of the present invention;

FIG. 16 is a plan view for explaining a method of forming a liquid film according to another embodiment of the present invention; and FIG. 17 is a plan view for explaining a method of forming a liquid film according to still another embodiment of the present invention.

DETAILED DESCRIPTION OF THE INVENTION

Now, various preferable embodiments of the present invention will be described with reference to the accompanying drawings.

Figure 4:
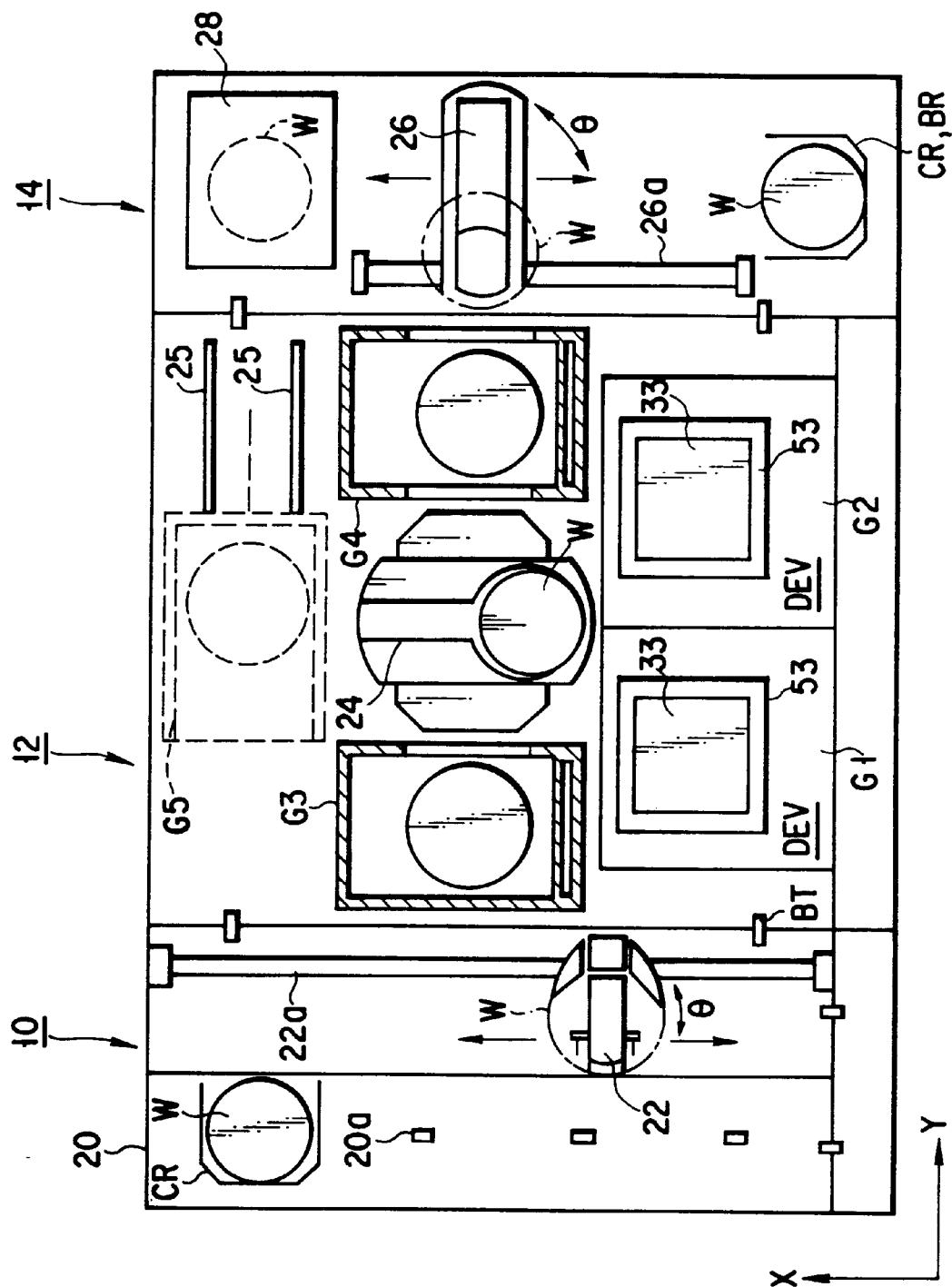
FIG. 4 is a schematic plan view showing a substrate process system.

As shown in FIG. 4, a wafer process system has a cassette section 10, a process section 12, and an interface section 14. A light-exposure apparatus (not shown) is connected to the wafer process system via the interface section 14. The cassette section 10 has a cassette table 20 and a sub-arm mechanism 22. Four projections 20a are formed on the cassette table 20. Cassettes CR are positioned rightly on the cassette table 20 by means of the projections 20a. A transfer passage 22a is provided along the cassette table 20. A first sub-arm mechanism 22 runs on the transfer passage 22a. The first sub-arm mechanism 22 has a back and forth mechanism for moving a wafer holder back and forth, an X-axis moving mechanism for moving the wafer holder in an X-axis, a Z-axis moving mechanism for moving the wafer holder in a Z-axis direction, and a θ rotation mechanism for swinging the wafer holder about the Z-axis. The first sub-arm mechanism 22 plays a role in taking out the wafer W from the cassette CR and transporting it to the process section 12.

The process section 12 has a main arm mechanism 24. Five process units G1 to G5 are provided so as to surround the main arm mechanism 24. The main arm mechanism 24 has a wafer holder, a back and forth mechanism for moving the wafer holder back and forth, a Z-axis moving mechanism for moving the wafer holder in the Z-axis direction, and a θ rotation mechanism for swinging the wafer holder about the Z-axis. The main arm mechanism 24 plays a role in transporting the wafer W to each of units G1 to G5. The wafer W is transferred between the first sub arm mechanism and the main arm mechanism 24 via a loading/unloading unit of a third group G3.

As shown in FIG. 5, first and second process units G1 and G2 are arranged in a front side of the wafer process system.

Each of the first and second process units has a resist coating unit (COT) and a developing unit (DEV). The developing unit (DEV) is arranged above the resist coating unit (COT). Above the developing unit (COT), a fine filer unit (FFU) 18 is arranged. The FFU 18 houses a filter and a fan which are responsible for removing particles and organic substances, thereby sending a clean air downward. By the function of FFU 18, a down-flow of clean air can be generated within the developing unit (DEV) and the resist coating unit (COT). Note that FFU 18 is provided also in the upper portions of the cassette section 10 as well as in the interface section 14.

The third group G3, which is arranged near the cassette section 10, has a baking unit, a cooling unit, an adhesion unit, and a loading/unloading unit, all stacked tandemly in multiple stages. The fourth group G4, which is arranged near the interface section 14, has a baking unit, a cooling unit, a washing unit, and a loading/unloading unit, all stacked tandemly in multiple stages. The fifth group G5 may be arbitrarily provided and additionally provided in case of process unit shortage. The fifth group G5 is arranged in a back side of the wafer process system and provided along the rail 25 and movably in the Y-axis direction.

The interface section 14 includes a second sub arm mechanism 26, a stand-by section 28, and a buffer cassette BR. The interface section 14 has a transportation passage 26a therein. A second sub-arm mechanism 26 runs on the transportation passage 26a. The second sub-arm mechanism 26 includes a wafer holder, a back-and-forth moving mechanism for moving the wafer holder back and forth, an X-axis moving mechanism for moving the wafer holder in the X-axis direction, a Z-axis moving mechanism for moving the wafer holder in a Z-axis direction, and a θ-rotation mechanism for swinging the wafer holder about the Z-axis. The second sub arm mechanism 26 is responsible for transporting the wafer W to each of the stand-by section 28, the buffer cassette BR, and the light-exposure apparatus (not shown).

Now, referring to FIGS. 6 to 8, we will explain the developing unit (DEV) serving as an apparatus for forming a liquid-film will be explained.

The developing unit (DEV) has a spin chuck 2, a tray section 30, a supply nozzle 40, a cup 53 and developing solution supply mechanisms 42 to 47. The spin chuck 2 has a motor 3 for spin-rotating the wafer W about the Z-axis, an adsorption-holding mechanism (not shown) for vacuum-adsorbing the wafer W at a central rear surface of the wafer W, and a liftable cylinder 4 for moving the wafer W in the Z-axis direction. The rotation axis 3a of the motor 3 is introduced into the cup 53 through a hollow member 50. The motor 3 is supported by the rod 4a of the liftable cylinder 4 via a connecting support member 5. The spin chuck 2 is moved up by projecting the rod 4a from the cylinder 4. When the upper edge surface of the spin chuck 2 comes in contact with the rear surface of the wafer W, the wafer W is adsorbed and held by the spin chuck 2.

The tray section 30, rectangular or square in shape, is placed horizontally by being supported at four corners by the hollow member 50 via four supporting mallets 51. The tray section 30 has a peripheral holding portion (substrate holding portion) 31, a liquid-receiving base 32, and an embankment 33. The peripheral holding portion 31 (ring form), holds the wafer W at a peripheral portion of the rear surface. The liquid-receiving base 32 (ring form) is continuously provided along outer peripheral edge of the peripheral holding portion 31 and at a higher position than the peripheral holding portion 31. To be more specific, there is a difference (step) in height between the liquid-receiving base 32 and the peripheral holding portion 31. The rise of the step is substantially the same as the thickness of the wafer W. When the wafer W is mounted on the tray section 30 and held by the peripheral holding portion 31, the upper surface of the wafer W is equal in level to the upper surface of the liquid-receiving base 32 to thereby form the same plane. Note that the step-rise between the members 31 and 32 may be larger or shorter than the thickness of the wafer W.

The embankment 33 is continuously formed on the peripheral edge of the liquid-receiving base 32 so as to stand outwardly and upwardly. The embankment 33 prevents the developing solution 1 from flowing down from the tray section 30 and assists the liquid-receiving base 32 to store the developing solution 10. The height of the embankment 33 is, for example, 3 mm.

The liquid-receiving base 32, square or rectangular in shape, whose side is larger than the diameter of the wafer W. In the region of the wafer W facing the orientation flat (O. F.), the inner edge of the liquid-receiving base 32 is substantially parallel to the outer edge thereof. A liquid-receiving face 32a is formed therein. As shown in FIG. 6, the width L of the liquid-receiving face 32a is about 3 mm.

The cup 53 is formed so as to surround the side and lower parts of the tray section 30. The cup 53 is responsible for receiving a liquid (developing solution and rinse solution) scattering toward the outside of the apparatus. The received liquid is discharged from the bottom of the cup 53 and flows out through a discharge passage 54.

As shown in FIG. 9, a developing solution supply nozzle 40 and a rinse nozzle 70 are arranged respectively at a home position so as to sandwich the cup 53. The supply nozzle 40 is arranged near one side of the cup 53 (square shape). The rinse nozzle 70 is arranged near the opposite side of the cup 53. The nozzles 40 and 70 are linear nozzles extending in the X-axis direction. Numerous holes are arranged at the liquid spray portion.

A grab arm 60 is positioned near the cup 53. The grab arm 60 is constituted of a ball screw 61, a stepping motor 62, a ball nut 63, a horizontal arm 64, a chuck portion 65, a liftable mechanism for the chuck portion 65 (not shown), a pair of nails 65a, and a driving mechanism for opening/closing the pair of nails 65a. The ball screw 61 is provided at least between the home position for the supply nozzle 40 and the home position for the rinse nozzle 70 and extends along the Y-axis direction. The grab arm mechanism 60 is provided outside and above the cup 53. The grab arm mechanism 60 selectively holds either the nozzle 40 or the nozzle 70 and transport it from the home position to an operating position.

Figure 10:
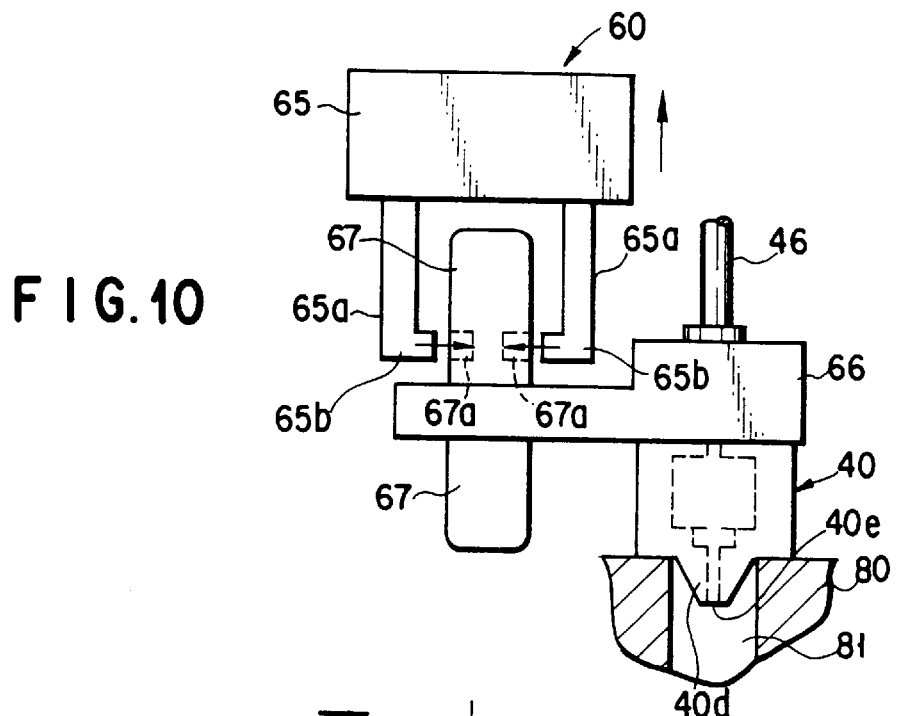
FIG. 10 a cross sectional view of a nozzle moving mechanism, a developing nozzle, and a stand-by section, partly in section.

As shown in FIG. 10, a stand-by section 80 is provided at the home position for the supply nozzle 40. A liquid spray portion 40d of the nozzle 40 is inserted into an inner atmosphere 81 of the stand-by section 80. The inner atmosphere 81 is set at the most suitable humidity/temperature. Therefore, the inside of a liquid passage 40e is prevented from being dried. The nozzle 40 is connected to a member 67 by way of a member 66. A plurality of recesses 67a are formed at the side portions of the member 67. When the chuck portion 65 is operated, the nails 65a are engaged with the corresponding recesses 67a. In this mechanism, the chuck portion 65 is connected to the supply nozzle 40. Such grab arm mechanism 60 is disclosed in U.S. Pat. No. 5,672,205.

Next, referring to FIG. 6, we will explain the supply system for supplying the developing solution to the nozzle 40.

A developing solution supply line 46 is formed from the tank 42 to the nozzle 40. The developing solution 10 is stored in the tank 42. A pressurized $N_2$ gas is introduced into the tank 42 from a $N_2$ gas supply source 47. The supply line 46 is sequentially equipped with a filter 43, a flow rate counter 44, and an open/shut valve 45. Initiation and termination of the developing solution 10 to the nozzle 40 is controlled by the open/shut valve 45.

As shown in FIG. 9, a rinse nozzle 70 is placed on a tray section (not shown) outside the cup 53. The rinse nozzle 70 is communicated with the pure water supply source (not shown) via a supply line (not shown). After completion of the developing process, the rinse nozzle 70 is transported by the grab arm mechanism 60 and washes the wafer W and the liquid-receiving base 32 while pouring pure water thereto.

As shown in FIGS. 6 and 7, four rinse nozzles 7 are arranged below the spin chuck 2. Each of the rinse nozzles 7 is communicated by way of a supply line 7a with a pure wafer supply source (not shown) disposed outside the cup 53. The supply line 7a is introduced into the cup 53 through the hollow member 50. The liquid spray portion of the rinse nozzle 7 is inclined upwardly so as to pour pure water onto the peripheral portion of the rear surfaces of the tray section 30 and the wafer W when the tray section 30 is descended.

Figure 11:
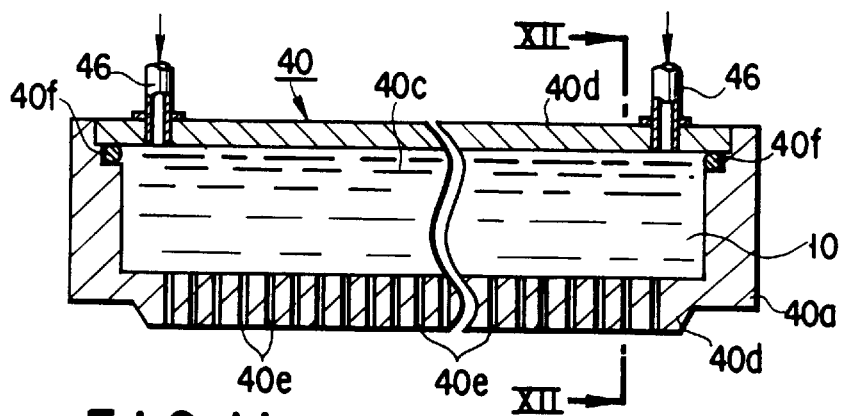
FIG. 11 is a long-side sectional view of the developing nozzle.
Figure 12:
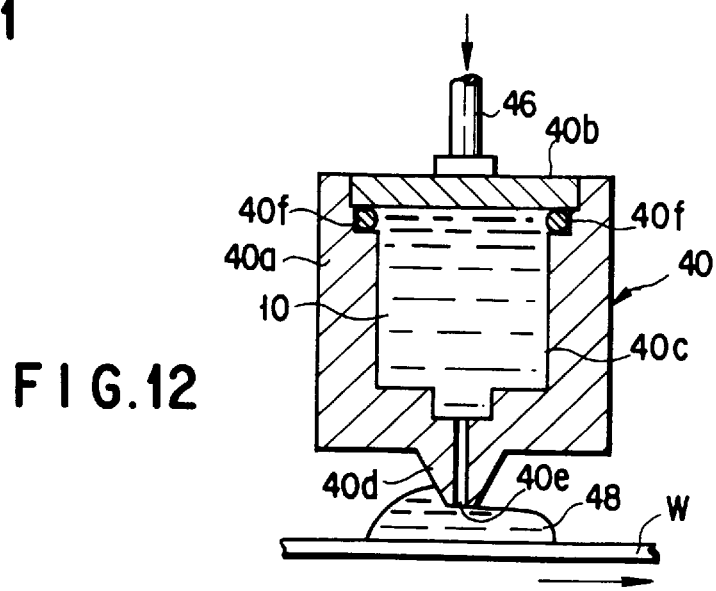
FIG. 12 is a short-side cross sectional view of the developing nozzle.
Figure 13:
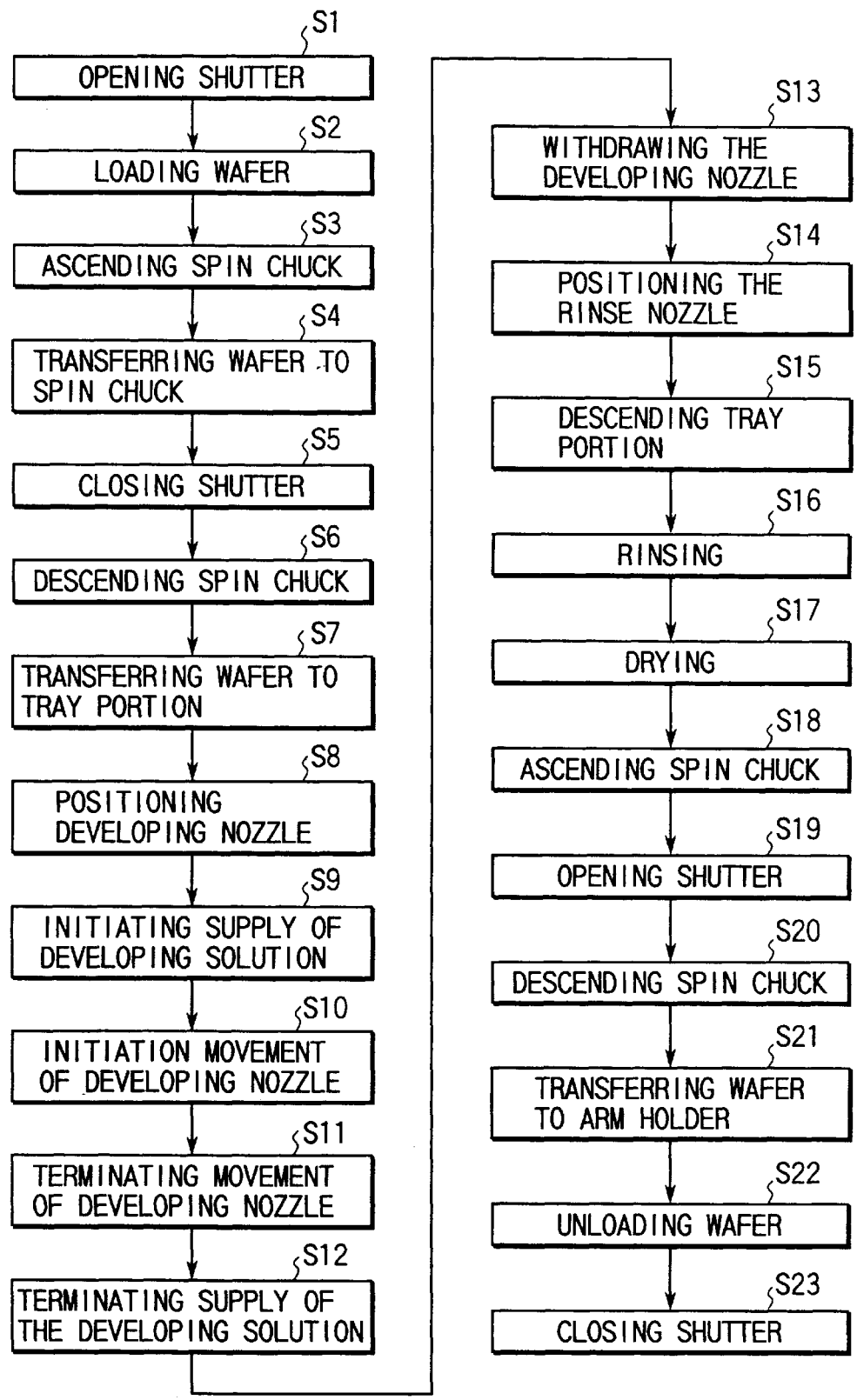
FIG. 13 is a flow chart showing a method of forming a liquid film according to an embodiment of the present invention.

Next, the developing solution supply nozzle 40 will be explained with reference to FIGS. 11 and 12. The developing solution supply nozzle 40 is a uni-directionally extending linear nozzle. The nozzle 40 is constituted of a main body case 40a, a top cover 40b, a liquid store portion 40c, a liquid spray portion 40d, spray holes 40e, and seal rings 40f. The top cover 40b is covered over the main body case 40a. The developing solution 10 is introduced into the liquid store portion 40c by way of a pipe 46 formed through the top cover 40b. The lower portion of the liquid store portion 40c is communicated with numerous spray holes 40e. The length of the liquid spray portion 40d is virtually equal to the diameter of the wafer W. For instance, if the wafer W has a diameter of 200 mm, the length of the liquid spray portion 40d is 204 mm. Numerous spray holes 40e are linearly arranged in the liquid discharge portion 40d.

Now, referring to FIGS. 13, 14A to 14C, we will explain a method of forming a liquid film of a developing solution on the wafer W by use of the aforementioned apparatus.

The wafer W is transferred to the second sub-arm mechanism 26 from the light exposing apparatus (not shown) and transferred to the main arm mechanism 24 via a loading/unloading unit belonging to the fourth group G4. The main arm mechanism 24 transfers the wafer W to the developing unit DEV of the first group G1.

A shutter (not shown) is opened (Step S1) and the wafer W is loaded into the developing unit DEV (Step S2). Then the spin chuck 2 is ascended to above the cup 53 (Step S3). The wafer W is transferred from the holder of the main arm mechanism 24 to the spin chuck 2 (Step S4). After the holder of the main arm mechanism 24 is withdrawn, the shutter is closed (Step S5). Then, the spin chuck 2 is descended (Step S6). In this manner, the wafer W is transferred from the spin chuck 2 to the tray section 30 (Step S7).

The grab arm mechanism 60 grabs a supply nozzle 4 and transfers it to the position outside the orientation flat (O. F.) and above the liquid-receiving base 32 (Step S8). In the step S8, the supply nozzle 40 is positioned so that the distance between the spray holes 40e and the liquid-receiving base 32 is set at about 1 mm.

Figure 14A:
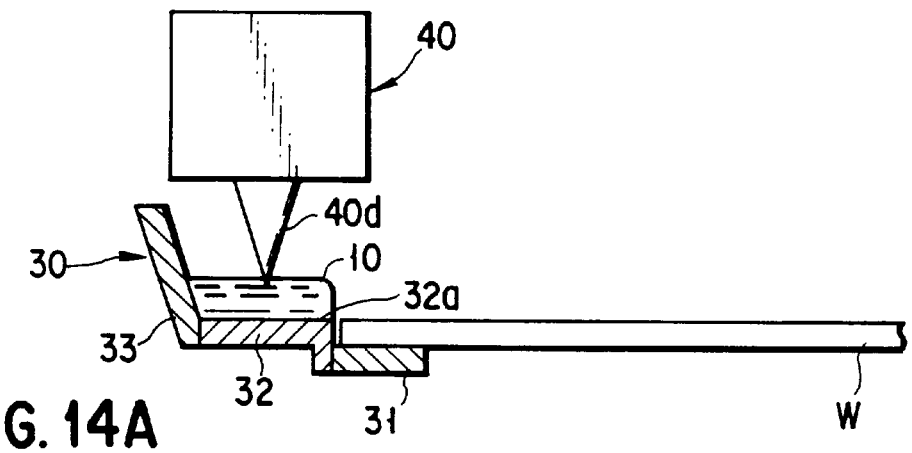
FIGS. 14A to 14C are schematic views for explaining a method of forming a liquid film.
Figure 14B:
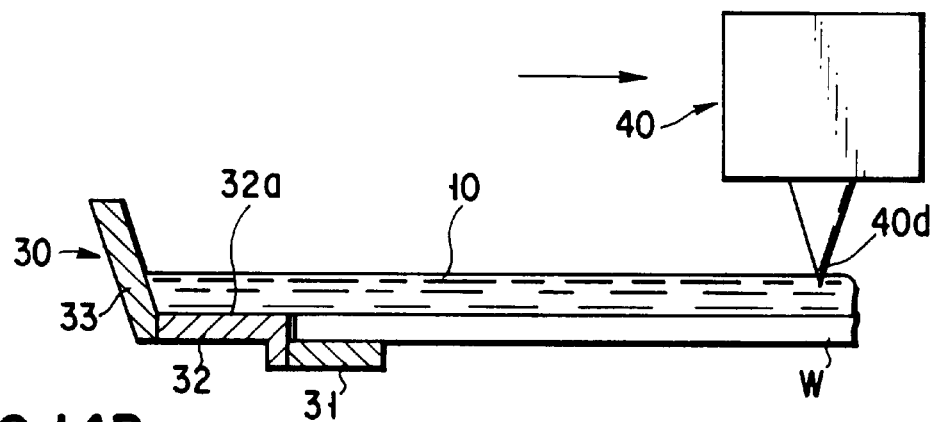

As shown in FIG. 14A, the spray of the developing solution 10 from the supply nozzle 40 is initiated. The developing solution 10 is mounted on the liquid-receiving base 32 along a side of the tray section 30 in a depth of about 1.2 mm (Step S9). While the supply nozzle 40 is maintained at the same level and the developing solution 10 is sprayed at a rate of 25 cc/second, the supply nozzle 40 is moved at a speed of about 10 cm/second toward the opposite side of the tray section 30 (Step S10). As shown in FIG. 14B, the supply nozzle 40 is scan-moved along the upper surface of the wafer W to thereby mount the developing solution 10 over the entire surface of the wafer W. The supply nozzle 40 is stopped at the liquid-receiving base 32 between the aforementioned opposite side of the tray section 30 and the wafer W (Step S11). Simultaneously, supply of the developing solution 10 is terminated (Step S12). The developing solution initially mounted on the liquid-receiving base 32 is partially spread over the upper surface of the wafer W to form a liquid film (about 1.2 mm thick) of the developing solution 10 over the upper surface of the wafer W, through the steps of S9 to S12. It is preferable that the thickness of the liquid film of the developing solution 10 should be about 1.2 mm or more. A small slit is formed between the inner peripheral edge of the liquid-receiving base 32 and the outer peripheral edge of the wafer W. However, the small slit is bottomed by the peripheral holding portion 31. Hence, the developing solution is introduced into the slit but the amount thereof is negligibly small.

Figure 14C:
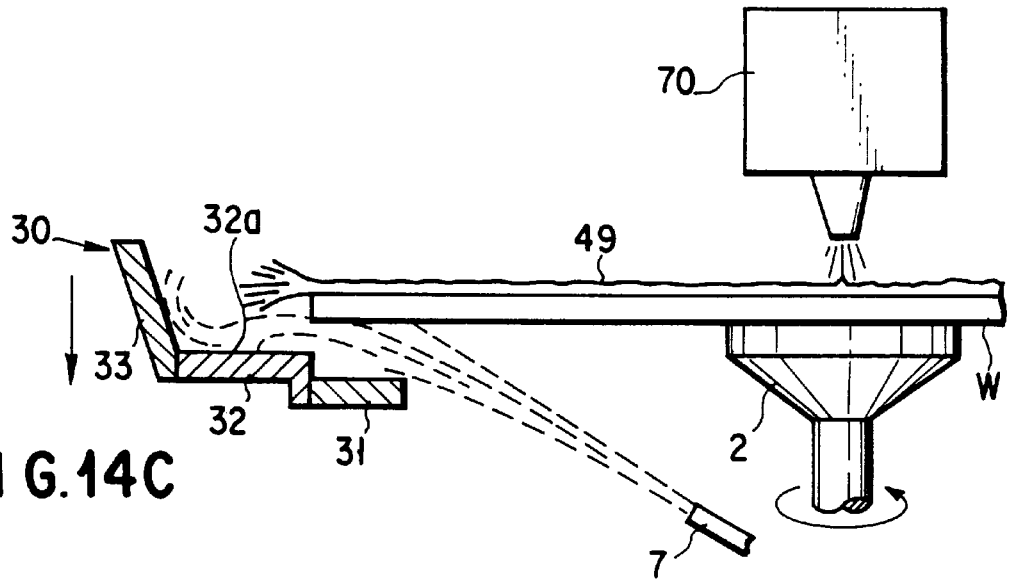

The supply nozzle 40 is withdrawn from the tray section 30 (Step 13). Instead, the rinse nozzle 70 is transported to the tray section 30 and placed at a right position (Step S14). After the development process is performed in a predetermined time, the tray section 30 is descended as shown in FIG. 14C. The developing solution 10 is discharged from the wafer W and liquid-receiving base 32 (Step S15). While the wafer W is rotated by the spin chuck 2 and the rinse nozzle 70 is moved from one side of the tray section 30 to the opposite side thereof, pure water is sprayed to wash away the developing solution 10 from the liquid-receiving base 32 and the surface of the wafer W. Furthermore, the rinse nozzle 70 placed on the upper side of the wafer W is moved to a center of the wafer, thereby supplying pure wafer to the wafer W. In this way, the developing solution 10 still left on the wafer is shaken off (Step S16).

On the other hand, pure water is sprayed to the rear-surface peripheral edge portion of the wafer W to wash away the developing solution 10 supplied to the rear-surface peripheral edge portion. Simultaneously, the tray section 30 is rinsed. The spray of the pure water from the washing nozzles 70 and 7 is terminated and the rotation speed of the spin chuck 2 is increased, thereby shaking off the developing solution to dry the wafer W (Step S17).

The spin chuck 2 is ascended (Step S18) and the shutter is opened (Step S19). Then, the holder of the main arm mechanism 24 is inserted into the developing unit (DEV). The spin chuck 2 is descended (Step S20). The wafer W is transferred from the spin chuck 2 to the main arm mechanism 24 (Step S21). The wafer W is unloaded from the developing unit DEV (Step S22) and then the shutter is closed (Step S23).

According to the aforementioned embodiment, even if the particles are attached to the supply nozzle 40, it is possible to prevent the particles from moving from the nozzle 40 to the surface of the wafer W and attached thereto. When the particles are attached to the tip portion of the supply nozzle 40, the developing solution 10 may be contaminated with the particles when the developing solution is mounted on the wafer by being supplied from the supply nozzle 40. However, in this embodiment, since the developing solution is initially mounted onto the liquid-receiving base 32 outside the wafer W, even if the developing solution is spread toward the wafer W, it spreads in the extent of about 3/13. Therefore, the wafer W is prevented from being contaminated with the particles.

In this embodiment, the developing solution is initially mounted so as to cover a width of the effective area of the wafer W. To be more specific, the length of the mounted developing solution is equal to the diameter of the wafer W. While the initially mounted developing solution is extended along a so-called single plane which consists of the wafer W and the peripheral liquid-receiving base 32, the developing solution 10 is supplied from the supply nozzle 40 to form a liquid film of the developing solution 10 on the surface of the wafer W. Therefore, even if a scan speed (moving speed) of the supply nozzle 40 is increased, a liquid film can be formed uniformly over the entire surface of the wafer W. Consequently, the developing process is performed with a high reliability while ensuring a high throughput.

Figure 1:
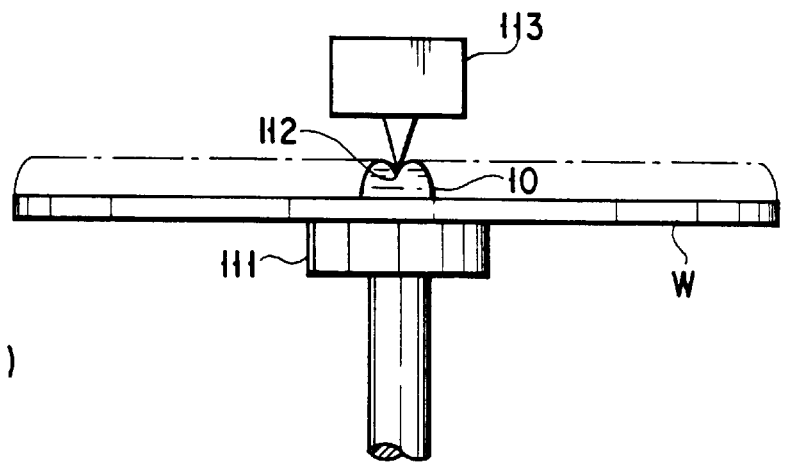
FIG. 1 is a schematic view for explaining a method of forming a liquid film on a substrate by use of a conventional apparatus.
Figure 2:
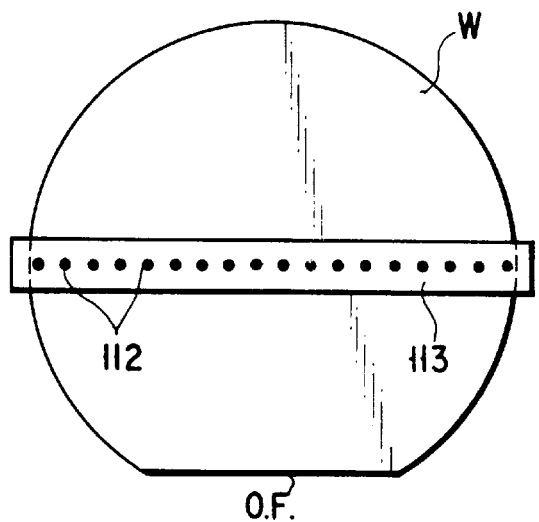
FIG. 2 is a schematic plan view for explaining a conventional method.
Figure 3:
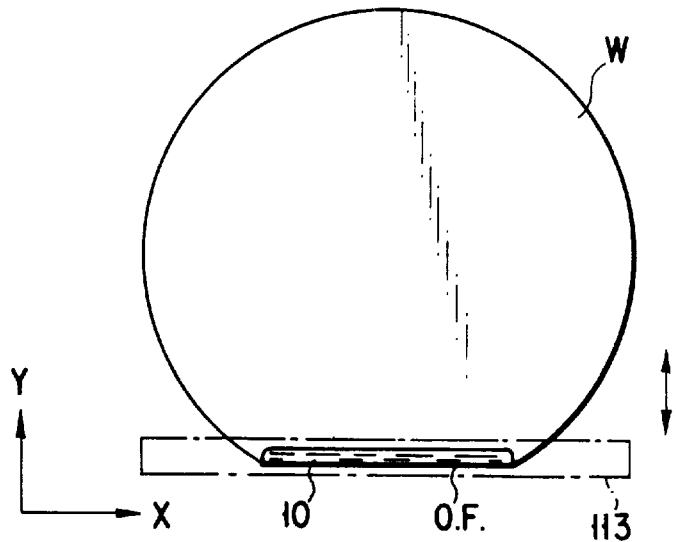
FIG. 3 is a schematic plan view for explaining a comparative method.
Figure 15A:
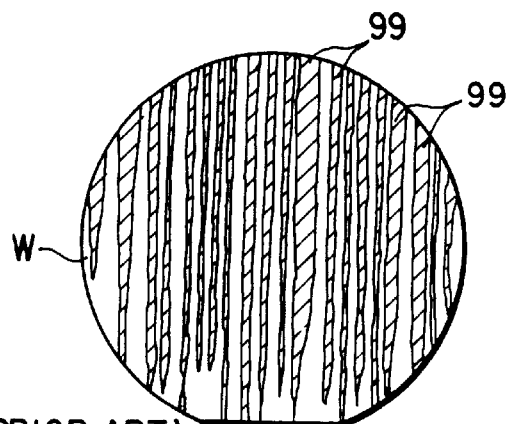
FIGS. 15 to 15C are plan views schematically showing a surface state of a wafer treated by a comparative method.
Figure 15B:
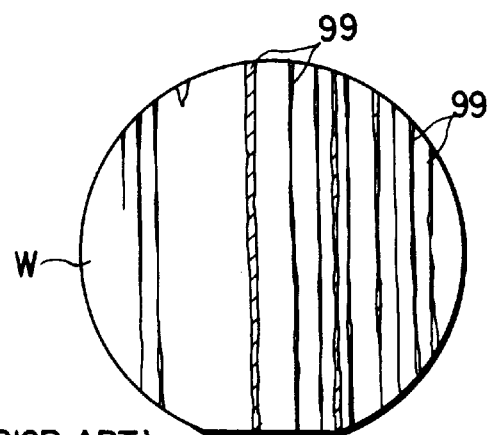
Figure 15C:
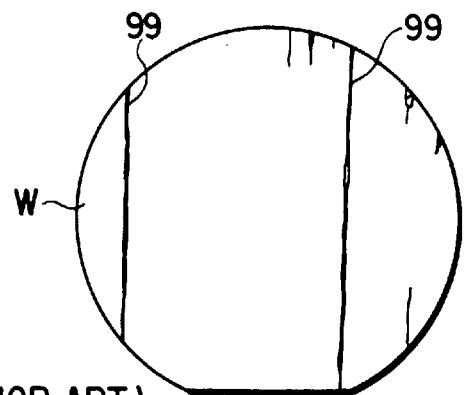

Then, we will take the aforementioned method explained with reference to FIG. 3 as a comparative example. In this comparative example, the wafer W is mounted on a table smaller than the wafer. The developing solution 10 is initially supplied from a nozzle 113 along an orientation flat (O. F.). The nozzle 113 is scan-moved along the wafer W to thereby mount the developing solution 10 over the entire surface of the wafer W. In the comparative example, the nozzle 113, whose length is equal to the diameter of the wafer W, is scan-moved while spraying the developing solution 10 at a flow rate of 25 cc/second. FIGS. 15A, 15B, and 15C show the surface states of the wafers W respectively in the cases where the nozzle 113 moves from one end of the wafer W to the other end for 1 second, 3 seconds and 5 seconds. The hatched area in the figures corresponds to the region with no the developing solution 10 coated thereon. The wafer used herein has 8 inch in diameter.

As is apparent from the results, when the nozzle 113 is moved uni-directionally without using the liquid-receiving base, a non-coating area is produced even if the supply nozzle 113 is moved slowly over the wafer for 5 seconds. Whereas, in the present invention, the developing solution is initially mounted on the wafer for 0.3 seconds, and thereafter, the supply nozzle is moved in as short a time as 0.5 seconds. However, the liquid film is formed uniformly on the wafer surface without the non-coating area of the developing solution 10.

As shown in FIG. 16, the developing solution is initially mounted on a region including a part of the wafer W. In the case shown in the figure, a V notch 88 is formed on the wafer W.

As shown in FIG. 17, the wafer W may be adsorbed and held by the spin chuck 2 in place of the peripheral holding portion 31. The wafer may be held by a pair of liquid-receiving bases 32a and 32b (provided both sides of the wafer) in contact with the outer peripheral edge of the wafer W in such a way that the developing solution 10 may not flow down from between the pair of liquid-receiving bases 32a, 32b and the wafer W.

The present invention is not limited to a semiconductor wafer W and may be applied to a glass substrate for a liquid crystal display apparatus (LCD substrate). In consideration of the enlargement of the LCD substrate, if the LCD substrate is held by the periphery holding portions, it is possible to prevent distortion of the LCD substrate. As a result, a liquid film can be formed highly uniformly. The process liquid is not limited to the developing solution and a resist solution may be used.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A liquid film formation apparatus comprising:
   a substrate holding portion for holding a substrate substantially horizontally so as to allow a pattern-to-be-formed surface to face upward;
   a liquid-receiving base surrounding the substrate held by the substrate holding portion and having a liquid-receiving face which is placed at substantially the same level as that of an upper surface of the substrate;
   a supply nozzle having a process-liquid spray section whose length is equal to or longer than the width of an effective region of the substrate; and
   a moving mechanism for moving said supply nozzle in the direction perpendicular to the longitudinal direction of the supply nozzle;
   wherein
   said substrate holding portion seals a slit formed between the liquid-receiving base and the outer peripheral portion of the substrate so as not to leak out the process solution from the slit, and
   the process solution is supplied from said supply nozzle to said liquid-receiving base to mount the process solution on the liquid-receiving base, and
   the process solution is subsequently mounted over an entire surface of the substrate by spraying the process solution from the supply nozzle while moving the supply nozzle.

2. The apparatus according to claim 1, further comprising an embankment provided near a region of the liquid-receiving base corresponding to a region on which the process solution is initially mounted, thereby preventing the process solution supplied to the liquid-receiving base from the supply nozzle from spilling out of the liquid-receiving base.

3. The apparatus according to claim 1, wherein said substrate holding portion has a ring portion in contact with a rear surface of the peripheral portion of the substrate, for holding the substrate, said ring portion being attached continuously to outer periphery of the liquid-receiving base.

4. The apparatus according to claim 3, wherein a slit is formed between the liquid-receiving base and the peripheral portion of the substrate, and the substrate holding portion is positioned below the slit.

5. The apparatus according to claim 1, wherein the liquid-receiving base is brought in contact with the peripheral portion of the substrate.

6. The apparatus according to claim 3, further comprising:
   a spin chuck for holding and rotating the substrate;
   a liftable mechanism for moving the substrate holding portion in relation to the spin chuck in such a way that the spin chuck passes through the ring portion to transfer the substrate from the substrate holding portion;
   a rinse nozzle positioned below the substrate holding portion, for supplying a rinse solution for washing out the process solution;
   wherein the substrate is held by the substrate holding portion when the process solution is supplied to the substrate from the supply nozzle, the substrate holding portion is descended in relation to the spin chuck by the liftable mechanism to deliver the substrate to the spin chuck, and the rinse solution supplied from the rinse nozzle is poured to the rear surface of the substrate and the substrate holding portion while rotating the substrate by the spin chuck, thereby washing out the process solution.

7. A method of forming a liquid film comprising the steps of:

(a) bringing a liquid-receiving base in contact with a periphery or in vicinity of a substrate held horizontally, said liquid-receiving base having a liquid-receiving face which is placed at substantially the same level of that of an upper surface of the substrate;

(b) mounting a process solution on the liquid-receiving base by supplying the process solution from a supply nozzle having a spray portion whose length is equal to or longer than a width of an effective region of the substrate; and (c) supplying the process solution from the supply nozzle while moving the supply nozzle in a direction perpendicular to the longitudinal direction of the supply nozzle, thereby mounting the process solution over an entire upper surface of the substrate.

8. The method according to claim 7, wherein, after the step (c), the rinse solution is supplied to the substrate from an upper side and a lower side of the substrate to wash away the process solution.

9. The method according to claim 7, wherein, after the step (c), the substrate is separated at a distance from the liquid-receiving face and a rinse solution is supplied toward the substrate from upper and lower sides of the substrate to wash the process solution away from the substrate, while rotating the substrate.

* * * * *